(12) United States Patent
Kim

(10) Patent No.: US 6,602,789 B2
(45) Date of Patent: Aug. 5, 2003

(54) METHOD OF FORMING A METAL LINE IN A SEMICONDUCTOR MEMORY DEVICE

(75) Inventor: Myeong-Cheol Kim, Kyonggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/006,199

(22) Filed: Dec. 4, 2001

(65) Prior Publication Data

US 2002/0072160 A1 Jun. 13, 2002

(30) Foreign Application Priority Data

Dec. 12, 2000 (KR) ............................... 2000-75570

(51) Int. Cl.⁷ ............................................ H01L 21/302
(52) U.S. Cl. ....................................................... 438/689
(58) Field of Search ................................ 438/689, 197, 438/704, 691, 706, 717, 725

(56) References Cited

U.S. PATENT DOCUMENTS 6,399,509 B1 * 6/2002 Lu et al. ..................... 438/706

* cited by examiner

Primary Examiner—David Nelms
Assistant Examiner—Thao Le
(74) Attorney, Agent, or Firm—Marger Johnson & McCollom, P.C.

(57) ABSTRACT

A preferred method of forming a metal line in a semiconductor memory device includes depositing first, second, and third metal layers on a semiconductor substrate. A fourth layer is deposited on the third metal layer. The fourth layer is etched to form a hard mask. A first cleaning process is performed using a first cleaning agent, a second cleaning agent, or both. The third metal layer is etched according to the hard mask. A second cleaning process is performed using the first cleaning agent or the first and second cleaning agents. The first and second metal layers are etched simultaneously according to the hard mask. A third cleaning process is performed using the second cleaning agent.

20 Claims, 4 Drawing Sheets

METHOD OF FORMING A METAL LINE IN A SEMICONDUCTOR MEMORY DEVICE

CROSS REFERENCE

This application claims the benefit, under 35 U.S.C. §119, of Korean Patent Application No. 2000-75570, filed on Dec. 12, 2000, the entirety of which is incorporated herein by reference.

BACKGROUND OF THE INVENTION

1. Field of the Invention

The present invention relates to a semiconductor memory device, and more particularly, to a method of forming a metal line in a semiconductor memory device.

2. Description of Related Art

A bit line of a semiconductor memory device is typically made of polycrystalline silicon or tungsten silicide. However, for a bit line of a dynamic random access memory (DRAM), having a design rule of less than about 0.15 mm, a low-resistance material is required. A low-resistance metal such as tungsten (W) has therefore been used to form bit lines of semiconductor memory devices. Methods of forming metal lines of semiconductor memory devices using such low-resistance metals are disclosed in Japanese Patent Publication Nos. 6-275625; 8-186120; and 9-199484.

A conventional method of forming a metal line for use in a semiconductor memory device begins by depositing a metal layer on a semiconductor substrate. The metal layer can include first, second, and third metal layers in a triple-layer structure. The first metal layer is a bit line and is preferably made of tungsten (W). The second metal layer is a barrier layer and is preferably made of titanium nitride (TiN). The third metal layer is an ohmic contact layer and is preferably made of titanium (Ti).

A silicon nitride film is formed on the third metal layer and a photoresist is applied to the silicon nitride film. The photoresist is patterned to form a photoresist pattern. The silicon nitride film is then patterned, using the photoresist pattern as a mask, to form a hard mask. The first, second, and third metal layers are then etched concurrently to form a metal line. Next, the photoresist pattern is removed through an ashing process, and the photoresist residue is removed through a cleaning process.

As described above, the conventional metal line has a three-layer structure in which layers of titanium, titanium nitride, and tungsten are sequentially formed on top of each other. Unfortunately, however, because the titanium layer, the titanium nitride layer, and the tungsten layer are all wet-etched and because a standard cleaning-1 (SC-1) type solution (NH4OH:H2O2:H2O) has a high cleaning power, an SC-1 type solution cannot be used as the cleaning agent. Similarly, a hydrogen fluoride (HF) solution, which also has a relatively high cleaning power, cannot be used as the cleaning agent in the cleaning process, since the titanium layer is wet-etched. A cleaning agent with a relatively low cleaning power must therefore be used for the cleaning process.

After etching the silicon nitride film and the metal layer, high conductive polymers are generated around exposed surfaces of the hard mask and the metal layer. Accordingly, when a cleaning agent having a relatively low cleaning power is used for the cleaning process, these conductive polymers are not sufficiently removed. Conductive polymers that are not sufficiently removed can cause short circuits, such as between a bit line and a storage contact. Furthermore, a micro-masking phenomenon can occur due to the irregular conductive polymers, causing a metal line pattern to be irregularly formed.

In the conventional method of forming a metal line, a portion of an etching gas generally remains after etching the silicon nitride film. Since the process of etching the silicon nitride mask and the process of etching the metal layer are sequentially performed in different chambers, any etching gas remaining after the process of etching the silicon nitride film can cause a side reaction resulting in an uncleanable condensation state. This condensed gas reacts with tungsten and prevents the tungsten from being etched, thereby resulting in an irregularly patterned tungsten layer. Defects due to conductive polymers and condensed gases represent about 40% of all defects in semiconductor memory devices.

SUMMARY OF THE INVENTION

To overcome the problems described above, embodiments of the present invention provide a method of forming a metal line in a semiconductor memory device that results in a high manufacturing yield.

The preferred method includes sequentially depositing first, second, and third metal layers on a semiconductor substrate. A fourth layer is then deposited on the third metal layer. The fourth layer is etched to form a hard mask. A first cleaning process is performed using a first cleaning agent, a second cleaning agent, or both. The third metal layer is etched according to the hard mask. The first cleaning agent is then used in a second cleaning process. The second cleaning process could also proceed, however, by using a second cleaning agent either before or after using the first cleaning agent. The first and second metal layers are then etched simultaneously according to the hard mask. A third cleaning process is performed using the second cleaning agent.

When the first and second cleaning agents are both used, the second cleaning agent is preferably used after using the first cleaning agent alone. The second cleaning agent preferably has a lower cleaning power than the first cleaning agent. The first cleaning agent can be a fluoride compound (such as HF) or an SC-1 type solution, and the second cleaning agent can be an organic cleaning agent containing an amine group, or a mixed solution of an acetic compound and a diluted HF solution.

The first metal layer preferably comprises titanium and functions as an ohmic contact layer. The second metal layer preferably comprises titanium nitride and functions as a barrier layer. The third metal layer preferably comprises tungsten and functions as a bit line. A fourth layer preferably comprises silicon nitride.

Using the methods of forming the metal line according to the present invention, line defects of the metal line such as short circuits between the bit line and the storage contact due to the conductive polymer and the etching gas condensation can be prevented, resulting in a higher manufacturing yield.

BRIEF DESCRIPTION OF THE DRAWINGS

A more complete understanding of the present invention and the advantages thereof may be obtained through the following detailed description of preferred embodiments, made with reference to the accompanying drawings, in which like reference numerals denote like parts, and in which.

DETAILED DESCRIPTION OF PREFERRED EMBODIMENTS

Figure 1:
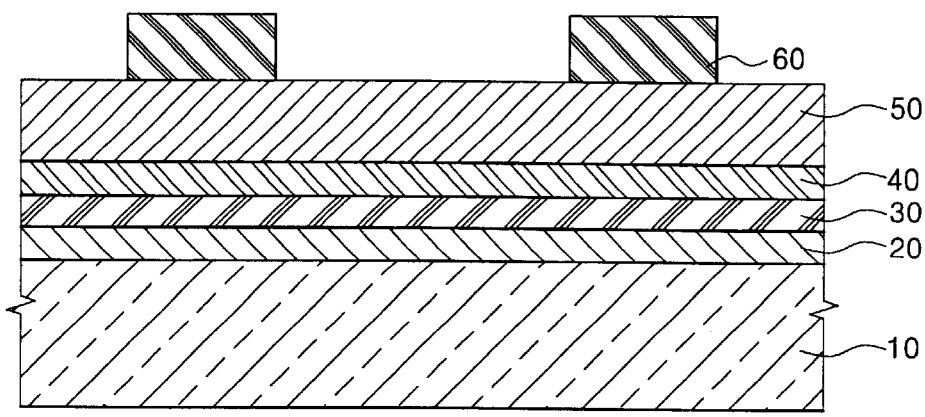
FIGS. 1 through 7 are cross-sectional views of a semiconductor device illustrating a process of forming a metal line according to a preferred embodiment of the present invention.

FIG. 1 is a cross-sectional view illustrating a metal line for use in a semiconductor memory device according to a preferred embodiment of the present invention. A first metal layer 20 is formed on a semiconductor substrate 10. The first metal layer 20 serves as an ohmic contact layer and is preferably made of titanium. A second metal layer 30 is formed on the first metal layer 20. The second metal layer 30 serves as a barrier layer and is preferably made of titanium nitride. A third metal layer 40 is formed on the second metal layer 30. The third metal layer serves as a bit line and is preferably made of tungsten. A fourth layer 50 is formed on the third metal layer 40 to form a self-aligned contact. The fourth layer provides a hard mask layer in a subsequent process.

A method of forming a metal line according to a preferred embodiment of the present invention will now be explained in further detail with reference to FIGS. 1 through 6. Referring to FIG. 1, first, second, and third metal layers 20, 30, 40 are sequentially deposited on the semiconductor substrate 10. A fourth layer 50, of silicon nitride film, is deposited on the third metal film 40. A photoresist is coated onto the fourth layer 50 and is then exposed to light to form a photoresist mask 60.

Figure 2:
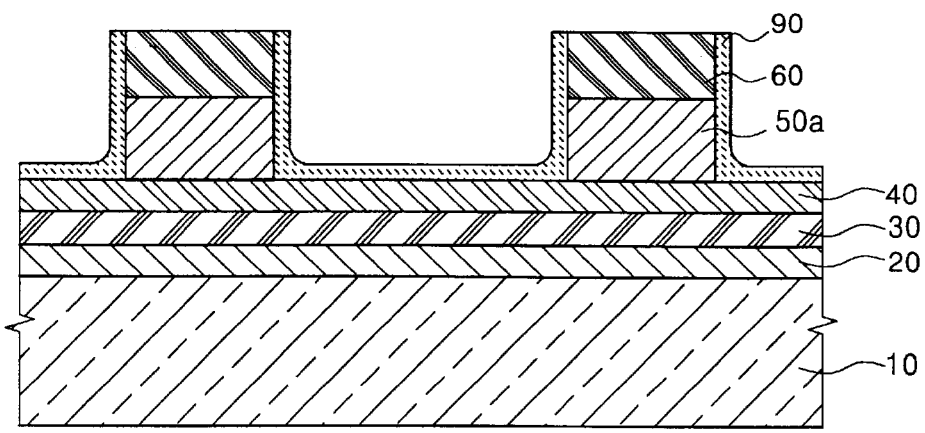

Referring to FIG. 2, the fourth, silicon nitride film layer 50 is then patterned using the photoresist mask 60 to form a hard mask 50a. To accomplish this, a dry-etching process using a fluorine-based etching gas such as CFx is preferably used. The tungsten layer 40 is typically over-etched through the etching process on the silicon nitride film 50. As a result, conductive polymers 90 are generated on exposed surfaces of the third metal layer 40, the hard mask 50a, and the photoresist mask 60. Condensation of the etching gas also occurs. The photoresist mask 60 on the hard mask 50a is removed through an ashing process.

Figure 3:
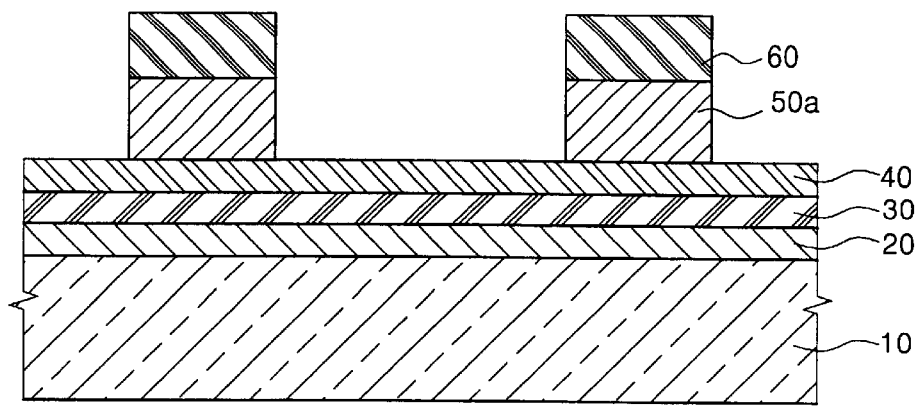

The conductive polymers 90 and the condensed etching gas are removed through a first cleaning process. The resulting structure is shown in FIG. 3. The first cleaning process may be performed using one or two cleaning agents. A second cleaning agent has a lower cleaning power than a first cleaning agent and can be used together with the first cleaning agent, after the first cleaning agent, or instead of the first cleaning agent. A high cleaning power fluoride compound (e.g., HF) is preferably used as the first cleaning agent because only the third, tungsten metal layer 40 is exposed. An SC-1 type solution could also be used because the cleaning effect of the SC-1 type solution is similar to that of the HF solution. Organic cleaning agents, such as those used in resist stripping (e.g., EKC, available from the EKC corporation), that contain an amine group, can be used as the second cleaning agent. A mixed solution of an acetic compound and a diluted HF solution could also be used as the second cleaning agent. The conductive polymers can be removed more effectively if the first and second cleaning agents are used together in the first cleaning process. The condensed etching gas can also be removed through the first cleaning process, thereby eliminating defects due to the presence of the condensed etching gas.

Figure 4:
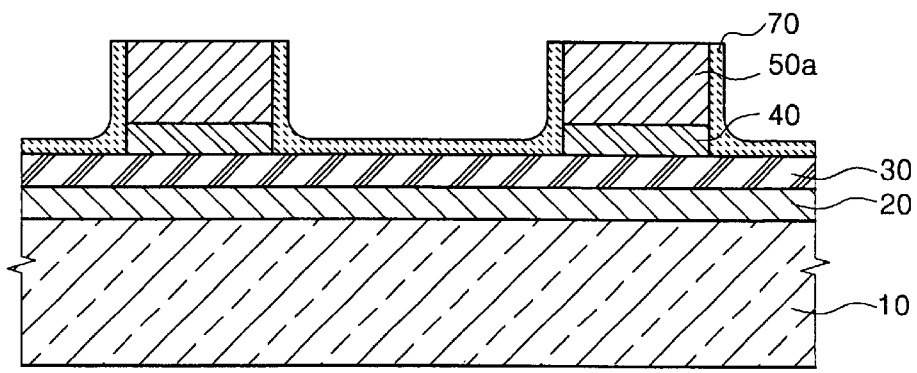

Referring to FIG. 4, the third (tungsten) metal layer 40 is dry-etched using a fluorine-based etching gas such as SF6 and the hard mask 50a until the second metal layer 30 is exposed. The second metal layer 30 has a slower etching rate in the fluorine-based etching gas than in a chloride-based etching gas and the etching process therefore stops at the second (titanium nitride) metal layer 30. This is because titanium nitride generates etching by-products such as TiFx during exposure to the fluorine-based etching gas. More particularly, the titanium-fluorine-based conductive polymers 70 such as TiFx, formed on an exposed surface of the second metal layer 30, only permit the second metal layer 30 to be etched about 100 Å before the etching process is stopped.

Figure 5:
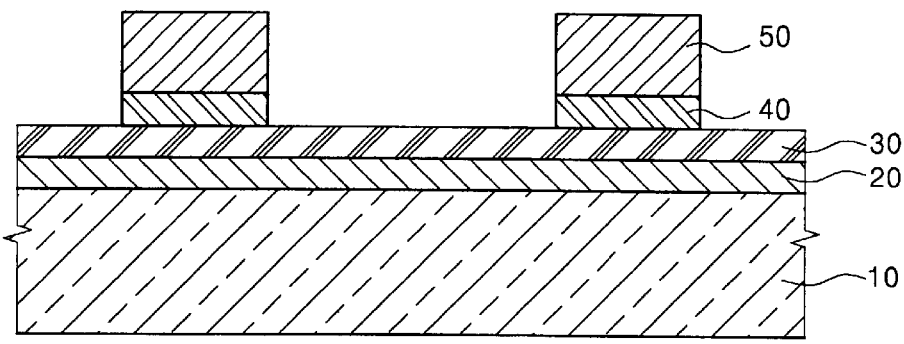

These conductive polymers 70 are also formed on exposed surfaces of the third metal layer 40 and the hard mask 50a. The conductive polymers 70 include Ti, Si, W, F, and N-based polymers, and the like. Referring to FIG. 5, these conductive polymers 70 are removed through a second cleaning process. In the second cleaning process, similar to the first cleaning process, an HF solution is preferably used as a first cleaning agent. The HF solution can be used to remove the polymer in this embodiment because it has a water to HF mixing ratio of about 200:1. It therefore etches the tungsten and titanium nitride layers 30, 40 only slightly (i.e., as little as about 10 Å) so as not to cause defects in the metal line. When the HF solution is used for a predetermined time period (e.g., about X minutes), during the second cleaning process, the conductive polymers 70 formed on the exposed surfaces of the hard mask 50a and the second and third metal layers 30, 40 are efficiently removed. The SC-1 type solution can also be used because it has the same cleaning effect as the HF solution.

Like the first cleaning process, the second cleaning process may be performed using a first and/or a second cleaning agent. The second cleaning agent preferably has a lower cleaning power than the first cleaning agent and can be used before or after the first cleaning agent. Organic cleaning agents containing an amine group, or a mixed solution of an acetic compound and a diluted HF solution can be used as the second cleaning agent. If the first and second cleaning agents are both used in the second cleaning process, the conductive polymers 70 can be more effectively removed.

Figure 6:
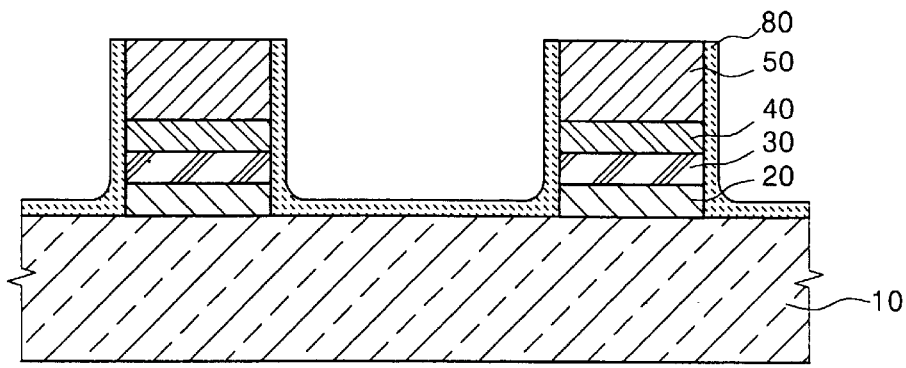
Figure 7:
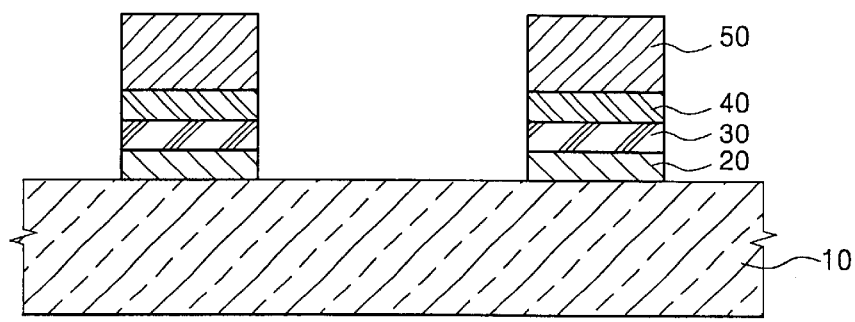

Referring to FIG. 6, following the second cleaning process, the first and second metal layers 20, 30 are etched concurrently according to the hard mask 50a. An etching gas containing a chloride is preferably used. As in the process of patterning the third metal layer 50, polymers 80 are generated during the etching of the first and second metal layers 20, 30. A third cleaning process is therefore performed to remove the polymers 80. The chloride-based gas, however, generates relatively few polymers 80 compared to the fluorine-based etching gas and an organic cleaning agent that contains an amine group, or a mixed solution of an acetic compound and a diluted HF solution, can effectively remove the polymers 80. The polymers 80 can therefore be easily removed using just the second cleaning agent, having a relative low cleaning power. After the third cleaning process, construction of the metal line, shown in FIG. 7, is complete.

In conclusion, the preferred embodiments of the present invention provide a method of forming metal lines that prevents metal line defects, such as short circuits between the bit line and the storage contact, caused by conductive polymers and etching gas condensation. This leads to a higher manufacturing yield.

Although the invention has been particularly shown and described with reference to preferred embodiments thereof, it will be understood by those skilled in the art that various changes in its form and details may be made without departing from the spirit and scope of the invention, as defined by the following claims.

What is claimed is:

1. A method of forming a metal line in a semiconductor memory device, said method comprising:
   depositing a first, second, and third metal layer on a semiconductor substrate;
   depositing a fourth layer on the third metal layer;
   etching the fourth layer to form a hard mask;
   performing a first cleaning process using a first cleaning agent, a second cleaning agent, or both first and second cleaning agents;
   etching the third metal layer according to the hard mask;
   performing a second cleaning process using the first cleaning agent;
   etching the first and second metal layers concurrently according to the hard mask; and
   performing a third cleaning process using the second cleaning agent.

2. A method according to claim 1, wherein the second cleaning agent is used together with the first cleaning agent in the first cleaning process.

3. A method according to claim 1, wherein the second cleaning agent has a lower cleaning power than the first cleaning agent.

4. A method according to claim 1, wherein the second cleaning agent is used after the first cleaning agent.

5. A method according to claim 4, wherein the second cleaning agent has a lower cleaning power than the first cleaning agent.

6. A method according to claim 1, wherein the first cleaning agent is either a fluoride compound or an SC-1 type solution, and wherein the second cleaning agent is either an organic cleaning agent with an amine group or a mixed solution of an acetic compound and a diluted HF solution.

7. A method according to claim 6, wherein the fluoride compound is HF.

8. A method according to claim 1, wherein the second cleaning process further uses a second cleaning agent before, after, or while using the first cleaning agent.

9. A method according to claim 8, wherein the second cleaning agent has a lower cleaning power that the first cleaning agent.

10. A method according to claim 8, wherein the first cleaning agent is HF or an SC-1 type solution, and wherein the second cleaning agent comprises either organic cleaning agents with an amine group or a mixed solution of an acetic compound and a diluted HF solution.

11. A method according to claim 1, wherein the first metal layer comprises titanium.

12. A method according to claim 1, wherein the second metal layer comprises titanium nitride.

13. A method according to claim 1, wherein the third metal layer comprises tungsten.

14. A method according to claim 1, wherein the fourth layer comprises silicon nitride.

15. A method according to claim 1, wherein the first metal layer is an ohmic contact layer.

16. A method according to claim 1, wherein the second metal layer is a barrier layer.

17. A method according to claim 1, wherein the third metal layer is a bit line.

18. A method of forming a metal line in a semiconductor memory device, said method comprising:
   sequentially depositing first, second, and third metal layers on a semiconductor substrate;
   depositing a fourth layer on the third metal layer;
   etching the fourth layer to form a hard mask;
   performing a first cleaning process using a first or second cleaning agent, or both;
   etching the third metal layer according to the hard mask; and
   performing a second cleaning process using the first cleaning agent.

19. A method according to claim 18, further comprising simultaneously etching the first and second metal layers according to the hard mask.

20. A method according to claim 19, further comprising performing a third cleaning process using the second cleaning agent.

* * * * *